US012712492B2

(12) United States Patent
Cahill et al.

(10) Patent No.: US 12,712,492 B2
(45) Date of Patent: Aug. 18, 2026

(54) AMPLIFIER SUPPLY CIRCUIT

(71) Applicant: Analog Devices International Unlimited Company, Limerick (IE)

(72) Inventors: Alan Cahill, Limerick (IE); Aidan Cahalane, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 508 days.

(21) Appl. No.: 18/222,186

(22) Filed: Jul. 14, 2023

(65) Prior Publication Data

US 2025/0023520 A1 Jan. 16, 2025

(51) Int. Cl.
*H03F 1/02* (2006.01)
*H03F 3/24* (2006.01)

(52) U.S. Cl.
CPC ........... *H03F 1/0222* (2013.01); *H03F 3/245* (2013.01); *H03F 2200/504* (2013.01)

(58) Field of Classification Search
CPC ........... H01P 5/16; H03F 1/0288; H03F 3/211
USPC .......................................................... 330/295
See application file for complete search history.

(56) References Cited

U.S. PATENT DOCUMENTS

2013/0135043 A1* 5/2013 Hietala ................... H03F 3/245 330/124 R
2014/0315504 A1* 10/2014 Sakai ...................... H03F 3/189 455/127.2
2018/0138863 A1* 5/2018 Khlat ...................... H03F 3/245
2020/0052584 A1* 2/2020 Watanabe ............... H02J 9/061
2022/0103137 A1* 3/2022 Khlat .................... H03F 1/0222
2023/0109988 A1* 4/2023 Jang ........................ H03F 3/245 330/108

OTHER PUBLICATIONS

Chin Hsia, "Integrated Current Detector for High Voltage Power Switches using LDMOS Transistors", 2016 International Symposium on Computer, Consumer and Control, IEEE Computer Society. (Year: 2016).*

(Continued)

*Primary Examiner* — Hafizur Rahman
(74) *Attorney, Agent, or Firm* — DLA PIPER LLP (US)

(57) ABSTRACT

The present disclosure relates to a circuit for setting an amplifier supply voltage for an amplifier. The circuit comprises a switch circuit having a first transistor arranged to switchably couple a first supply voltage to a supply terminal of the amplifier and a second transistor arranged to switchably couple a second supply voltage to the supply terminal of the amplifier, wherein a magnitude of the first supply voltage is greater than a magnitude of the second supply voltage. The circuit further comprises a control circuit arranged to control the switch circuit to set an amplifier supply voltage at the supply terminal of the amplifier based on an output signal of the amplifier. The control circuit is configured to set the amplifier supply voltage to substantially equal the second supply voltage when a magnitude of a tracking voltage is less than the magnitude of the second supply voltage and set the amplifier supply voltage to track the amplifier output signal when the magnitude of the tracking voltage is greater than the magnitude of the second supply voltage.

20 Claims, 13 Drawing Sheets

(56) References Cited

OTHER PUBLICATIONS

Wikipedia, "Power amplifier classes", 2008-2023; available from the Internet, <URL: https://en.wikipedia.org/wiki/Power_amplifier_classes>, (10 pgs).

Lollio et al, "A Class-G Headphone Amplifier in 65 nm CMOS Technology", Dec. 2010, IEEE Journal of Solid-State Circuits, vol. 45, pp. 2530-2542 (13 pgs).

* cited by examiner

AMPLIFIER SUPPLY CIRCUIT

BACKGROUND

A. Technical Field

The present disclosure relates to an amplifier supply circuit configured to control voltage supply to an amplifier.

B. Background

There are many different types, or classes, of power amplifier circuits, each having particular benefits and drawbacks. For example, class-A amplifiers are configured to have a 360° conducting angle, meaning that they amplify all of an input sinusoidal signal. Benefits of class-A amplifiers include simplicity and low levels of distortion. However, because class-A amplifiers are always conducting, they are relatively inefficient. Class-B amplifiers are similar to class-A amplifiers, but have a 180° conducting angle, meaning that they amplify only half of an input sinusoidal signal. As a result, they are more efficient than class-A amplifiers, but typically have higher levels of distortion.

Some particular classes of power amplifier are configured to change the supply voltage based on the size of the amplifier's output signal. For example, a class-G amplifier may switch between two different supply voltage levels, such as between a low voltage supply, V_low, and a high voltage supply, V_high. When the amplified output signal is relatively low (for example is less than V_low), the amplifier may use the low voltage supply. When the amplified output signal is relatively high (for example, is close to or greater than V_low), the amplifier may use the high voltage supply. In this way, the amplifier may be made more efficient by using a lower voltage supply whenever possible and only operating at the high power levels associated with the higher voltage supply when necessary. However, the amplifier may have reduced levels of linearity and may suffer from glitches, or noise, in the output signal when switching between the low and high supply voltages. A class-H amplifier is similar to a class-G amplifier, but rather than switching between discrete voltage supplies, the amplifier is configured to vary the supply voltage in a way that tracks the output voltage level. For example, the amplifier may be configured to maintain a supply voltage that is equal to the amplified output signal plus a pre-determined headroom voltage (for example, 2V). As a result, class-H amplifiers may be more power efficient that class-G amplifiers and may tend to have improved linearity and glitch immunity, but tend to be more complex and expensive.

SUMMARY

In a first aspect of the disclosure there is provided a circuit for setting an amplifier supply voltage for an amplifier, the circuit comprising: a switch circuit comprising: a first transistor arranged to switchably couple a first supply voltage to a supply terminal of the amplifier; and a second transistor arranged to switchably couple a second supply voltage to the supply terminal of the amplifier, wherein a magnitude of the first supply voltage is greater than a magnitude of the second supply voltage; and a control circuit configured to control the switch circuit to set an amplifier supply voltage at the supply terminal of the amplifier based on an output signal of the amplifier, wherein the control circuit is configured to set the amplifier supply voltage to substantially equal the second supply voltage when a magnitude of a tracking voltage is less than the magnitude of the second supply voltage and set the amplifier supply voltage to track the amplifier output signal when the magnitude of the tracking voltage is greater than the magnitude of the second supply voltage, and wherein the tracking voltage is based on the output signal of the amplifier.

In a second aspect of the disclosure there is provided a voltage supply circuit configured to set an amplifier supply voltage for a power amplifier, the voltage supply circuit comprising: a switch circuit for switchably coupling a supply terminal of the power amplifier between a first supply voltage and a second supply voltage, wherein a magnitude of the first supply voltage is greater than a magnitude of the second supply voltage, the switch circuit comprising: a first transistor comprising a first channel terminal coupled to the first supply voltage and a second channel terminal coupled to the supply terminal of the power amplifier; and a second transistor comprising a first channel terminal coupled to the supply terminal of the power amplifier and a second channel terminal coupled to the second supply voltage, wherein the first transistor and the second transistor are arranged in an anti-series configuration; and a control circuit configured to control the first transistor and the second transistor based on an output signal of the power amplifier.

In a third aspect of the disclosure, there is provided a supply circuit configured to set an amplifier supply voltage for an amplifier, the supply circuit comprising: a first transistor arranged to switchably couple a first supply voltage to a supply terminal of the amplifier; a second transistor arranged to switchably couple a second supply voltage to the supply terminal of the power amplifier, wherein a magnitude of the first supply voltage is greater than a magnitude of the second supply voltage; and a control circuit configured to control the first transistor and the second transistor based on an output signal of the amplifier, wherein the supply circuit is configured such that: when a magnitude of a tracking voltage is greater than the magnitude of the second supply voltage, the first transistor turns on and uses the first supply voltage to set the amplifier supply voltage to equal the tracking voltage, and the second transistor turns off to decouple the supply terminal of the power amplifier from the second supply voltage; and when the magnitude of the tracking voltage is less than the magnitude of the second supply voltage, the first transistor turns off to decouple the supply terminal of the power amplifier from the first supply voltage, and the second transistor turns on to couple the supply terminal of the power amplifier to the second supply voltage and set the amplifier supply voltage to substantially equal the second supply voltage, wherein the tracking voltage is dependent on the output signal of the amplifier.

In a fourth aspect of the disclosure, there is provided a voltage supply circuit for setting an amplifier supply voltage for an amplifier, the voltage supply circuit being configured to have a controllable mode of operation, wherein available modes of operation comprise a voltage tracking mode or a locked mode, wherein when the mode of operation is set to the voltage tracking mode, the voltage supply circuit operates to set an amplifier supply voltage based on a magnitude of an output voltage of the amplifier, and when the mode of operation is set to the locked mode, the voltage supply circuit operates to set the amplifier supply voltage to a fixed voltage.

Aspects of the Disclosure

Non-limiting aspects of the disclosure are set out in the following numbered clauses 1. A circuit for setting an amplifier supply voltage for an amplifier, the circuit comprising: a switch circuit comprising:
   a first transistor arranged to switchably couple a first supply voltage to a supply terminal of the amplifier; and
   a second transistor arranged to switchably couple a second supply voltage to the supply terminal of the amplifier, wherein a magnitude of the first supply voltage is greater than a magnitude of the second supply voltage; and a control circuit configured to control the switch circuit to set an amplifier supply voltage at the supply terminal of the amplifier based on an output signal of the amplifier,
   wherein the control circuit is configured to set the amplifier supply voltage to substantially equal the second supply voltage when a magnitude of a tracking voltage is less than the magnitude of the second supply voltage and set the amplifier supply voltage to track the amplifier output signal when the magnitude of the tracking voltage is greater than the magnitude of the second supply voltage, and
   wherein the tracking voltage is based on the output signal of the amplifier.

2. The circuit of clause 1, wherein the control circuit is configured to:
   When the magnitude of the tracking voltage is less than the magnitude of the second supply voltage, turn off the first transistor and turn on the second transistor, and
   When the magnitude of the tracking voltage is greater than the magnitude of the second supply voltage, turn on the first transistor and turn off the second transistor.

3. The circuit of clause 2, wherein the control circuit comprises:
   a first op amp coupled to the switch circuit and configured to turn on the first transistor when the magnitude of the tracking voltage is greater than the magnitude of the second supply voltage, and turn off the first transistor when the magnitude of the tracking voltage is less than the magnitude of the second supply voltage; and
   a second op amp coupled to the switch circuit and configured to turn on the second transistor when the magnitude of the tracking voltage is less than the magnitude of the second supply voltage, and turn off the second transistor when the magnitude of the tracking voltage is greater than the magnitude of the second supply voltage.

4. The circuit of clause 2 or clause 3, wherein the tracking voltage is equal to an output voltage of the amplifier plus a headroom voltage, or the tracking voltage is equal to the output voltage.

5. The circuit of any preceding clause, wherein the second transistor is arranged such that when a magnitude of the amplifier supply voltage is greater than a magnitude of the second supply voltage, a body diode of the second transistor is reverse biased so as to prevent current flow between the first supply voltage to the second supply voltage.

6. The circuit of any preceding clause, wherein the first transistor and the second transistor are coupled to each other in anti-series.

7. The circuit of any preceding clause, wherein the first transistor and the second transistor are both n-type transistors, and
   wherein a drain terminal of the first transistor is coupled to the first supply voltage, and a source terminal of the first transistor is coupled to the supply terminal of the amplifier, and
   wherein a drain terminal of the second transistor is coupled to the supply terminal of the amplifier, and a source terminal of the second transistor is coupled to the second supply voltage.

8. The circuit of any of clauses 1 to 6, wherein the first transistor and the second transistor are both p-type transistors, and
   wherein a source terminal of the first transistor is coupled to the first supply voltage, and a drain terminal of the first transistor is coupled to the supply terminal of the amplifier, and
   wherein a source terminal of the second transistor is coupled to the supply terminal of the amplifier, and a drain terminal of the second transistor is coupled to the second supply voltage.

9. A voltage supply circuit configured to set an amplifier supply voltage for a power amplifier, the voltage supply circuit comprising:
   a switch circuit for switchably coupling a supply terminal of the power amplifier between a first supply voltage and a second supply voltage, wherein a magnitude of the first supply voltage is greater than a magnitude of the second supply voltage, the switch circuit comprising:
   a first transistor comprising a first channel terminal coupled to the first supply voltage and a second channel terminal coupled to the supply terminal of the power amplifier; and
   a second transistor comprising a first channel terminal coupled to the supply terminal of the power amplifier and a second channel terminal coupled to the second supply voltage,
   wherein the first transistor and the second transistor are arranged in an anti-series configuration; and a control circuit configured to control the first transistor and the second transistor based on an output signal of the power amplifier.

10. The voltage supply circuit of clause 9, wherein the first transistor and the second transistor are both n-type transistors, and the first channel terminals are drain terminals and the second channel terminals are source terminals, or
   the first transistor and the second transistor are both p-type transistors, and the first channel terminals are source terminals and the second channel terminals are drain terminals.

11. The voltage supply circuit of clause 9 or clause 10, wherein the second transistor is arranged such that when a magnitude of the amplifier supply voltage is greater than the magnitude of the second supply voltage, a body diode of the second transistor is reverse biased so as to block current flowing between the supply terminal of the power amplifier and the second supply voltage.

12. The voltage supply circuit of any of clauses 9 to 11, wherein the control circuit is configured to, when a magnitude of tracking voltage is greater than the magnitude of the second supply voltage:
   turn on the first transistor such that the first transistor sets the amplifier supply voltage to equal the tracking voltage, and turn off the second transistor to decouple the supply terminal of the power amplifier from the second supply voltage;

wherein the tracking voltage is dependent on the output signal of the power amplifier.

13. The voltage supply circuit of clause 12, wherein the control circuit comprises: a first op amp comprising:

a first input terminal arranged to receive the amplifier supply voltage;

a second input terminal arranged to receive the tracking voltage; and an output terminal coupled to a control node of the first transistor so as to control the first transistor.

14. The voltage supply circuit of clause 13, configured such that, when the magnitude of the tracking voltage is greater than the magnitude of the second supply voltage, the first op-amp outputs a signal to turn on the first transistor by an amount necessary such that the amplifier supply voltage at the first input terminal is equal to the tracking voltage at the second input terminal.

15. The voltage supply circuit of any of clauses 9 to 14, wherein the first transistor is a p-type LDMOS transistor or an n-type LDMOS transistor.

16. The voltage supply circuit of any of clauses 12 to 15, wherein the control circuit is further configured to, when the magnitude of the tracking voltage is less than the magnitude of the second supply voltage:

turn off the first transistor to decouple the supply terminal of the power amplifier from the first supply voltage, and turn on the second transistor to couple the supply terminal of the power amplifier to the second supply voltage.

17. The voltage supply circuit of clause 16, wherein the control circuit comprises: a second op amp comprising:

a first input terminal arranged to receive the amplifier supply voltage;

a second input terminal arranged to receive the second supply voltage; and an output terminal coupled to a control node of the second transistor so as to turn the second transistor off when the magnitude of the amplifier supply voltage is greater than the magnitude of the second supply voltage and turn the second transistor on when the magnitude of the amplifier supply voltage is less than the magnitude of the second supply voltage.

18. The voltage supply circuit of clause 16 or clause 17, wherein the second transistor is a p-type LDMOS transistor or an n-type LDMOS transistor.

19. The voltage supply circuit of any of clauses 12 to 18, wherein the tracking voltage is a sum of an output voltage of the power amplifier and a predetermined headroom voltage.

20. A supply circuit configured to set an amplifier supply voltage for an amplifier, the supply circuit comprising:

a first transistor arranged to switchably couple a first supply voltage to a supply terminal of the amplifier;

a second transistor arranged to switchably couple a second supply voltage to the supply terminal of the power amplifier, wherein a magnitude of the first supply voltage is greater than a magnitude of the second supply voltage; and a control circuit configured to control the first transistor and the second transistor based on an output signal of the amplifier, wherein the supply circuit is configured such that:

when a magnitude of a tracking voltage is greater than the magnitude of the second supply voltage, the first transistor turns on and uses the first supply voltage to set the amplifier supply voltage to equal the tracking voltage, and the second transistor turns off to decouple the supply terminal of the power amplifier from the second supply voltage; and when the magnitude of the tracking voltage is less than the magnitude of the second supply voltage, the first transistor turns off to decouple the supply terminal of the power amplifier from the first supply voltage, and the second transistor turns on to couple the supply terminal of the power amplifier to the second supply voltage and set the amplifier supply voltage to substantially equal the second supply voltage, wherein the tracking voltage is dependent on the output signal of the amplifier.

21. The voltage supply circuit of clause 20, wherein the control circuit is configured, when the magnitude of the tracking voltage is greater than the magnitude of the second supply voltage, to turn on the first transistor by an amount necessary to set the amplifier supply voltage to equal the tracking voltage.

22. The voltage supply circuit of clause 20 or clause 21, wherein the tracking voltage is an output voltage of the amplifier plus a predetermined headroom voltage.

23. A voltage supply circuit for setting an amplifier supply voltage for an amplifier, the voltage supply circuit being configured to have a controllable mode of operation, wherein available modes of operation comprise a voltage tracking mode or a locked mode, wherein when the mode of operation is set to the voltage tracking mode, the voltage supply circuit operates to set an amplifier supply voltage based on a magnitude of an output voltage of the amplifier, and when the mode of operation is set to the locked mode, the voltage supply circuit operates to set the amplifier supply voltage to a fixed voltage.

24. The voltage supply circuit of clause 23, wherein the voltage supply circuit is for coupling to a first supply voltage and a second supply voltage, wherein a magnitude of the first supply voltage is greater than a magnitude of the second supply voltage, and when the mode of operation is set to the voltage tracking mode, the voltage supply circuit operates to set the amplifier supply voltage to a voltage that is between the first supply voltage and the second supply voltage based on the magnitude of the output voltage of the amplifier.

25. The voltage supply circuit of clause 24, wherein the locked mode comprises a locked low mode, and when the mode of operation is set to the locked low mode, the fixed voltage to which the amplifier supply voltage is set is the second supply voltage.

26. The voltage supply circuit of clause 24 or clause 25, wherein the locked mode comprises a locked high mode, and when the mode of operation is set to the locked high mode, the fixed voltage to which the amplifier supply voltage is set is the first supply voltage.

DRAWINGS

Aspects of the present disclosure are described, by way of example only, with reference to the following drawings, in which.

DETAILED DESCRIPTION

The present disclosure relates to a voltage supply circuit that is configured to set the voltage supplied to an amplifier based on the output voltage of the amplifier. In particular, the voltage supply circuit is configured to use two fixed voltage levels, $V_{low}$ and $V_{high}$, to set the power supply voltage for the amplifier. When the output voltage of the amplifier is relatively low, the voltage supply circuit is configured to set the amplifier supply voltage to $V_{low}$. When the output voltage of the amplifier is relatively high (for example, greater than $V_{low}$), the voltage supply circuit is configured to set the amplifier supply voltage to track the output voltage of the amplifier.

This behaviour enables an improvement in power efficiency, since the power supplied to the amplifier is kept at a reasonable level for the amplification needs of the amplifier, thereby minimising excess power usage by the amplifier. Furthermore, the voltage supply circuit is decoupled from the amplifier in as much as it simply sets the power supply voltage of the amplifier but does not affect, or interact with, the amplifier in any other way. Consequently, the amplifier may be afforded considerable design freedom, and also the voltage supply circuit may be used to improve the power efficiency of existing amplifiers.

Figure 1:
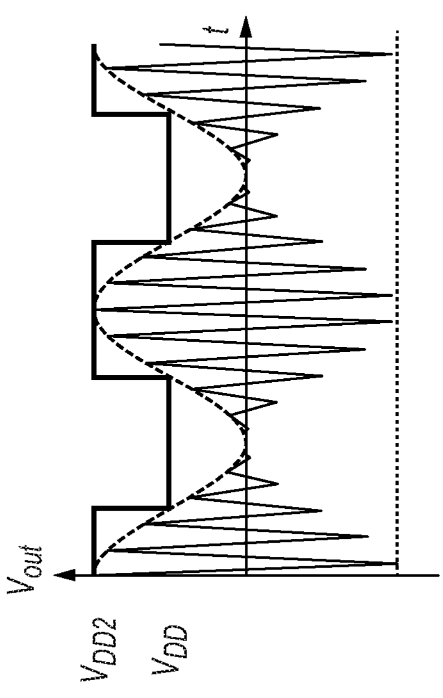
FIG. 1 shows an example of a typical class-G amplifier.
Figure 1:
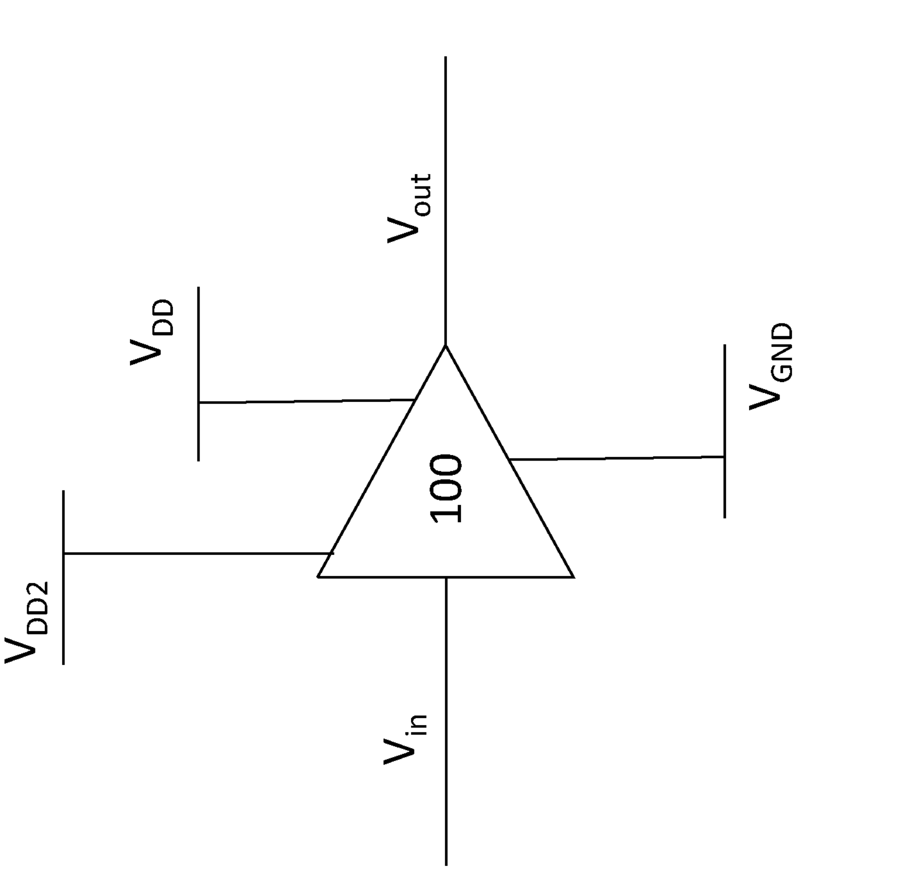

FIG. 1 shows an example of a typical class-G voltage amplifier 100 that switches between a low voltage supply $V_{DD}$ and a high voltage supply $V_{DD2}$. The amplifier 100 is configured to receive the input voltage Vin and amplify it to generate the amplified output voltage $V_{out}$. When the output voltage $V_{out}$ is relatively small, for example less than $V_{DD}$, the amplifier 100 is configured to be powered by the low voltage supply $V_{DD}$. When the output voltage $V_{out}$ is relatively large, for example greater than $V_{DD}$, the amplifier 100 is configured to be powered by the high voltage supply $V_{DD2}$.

Figure 2:
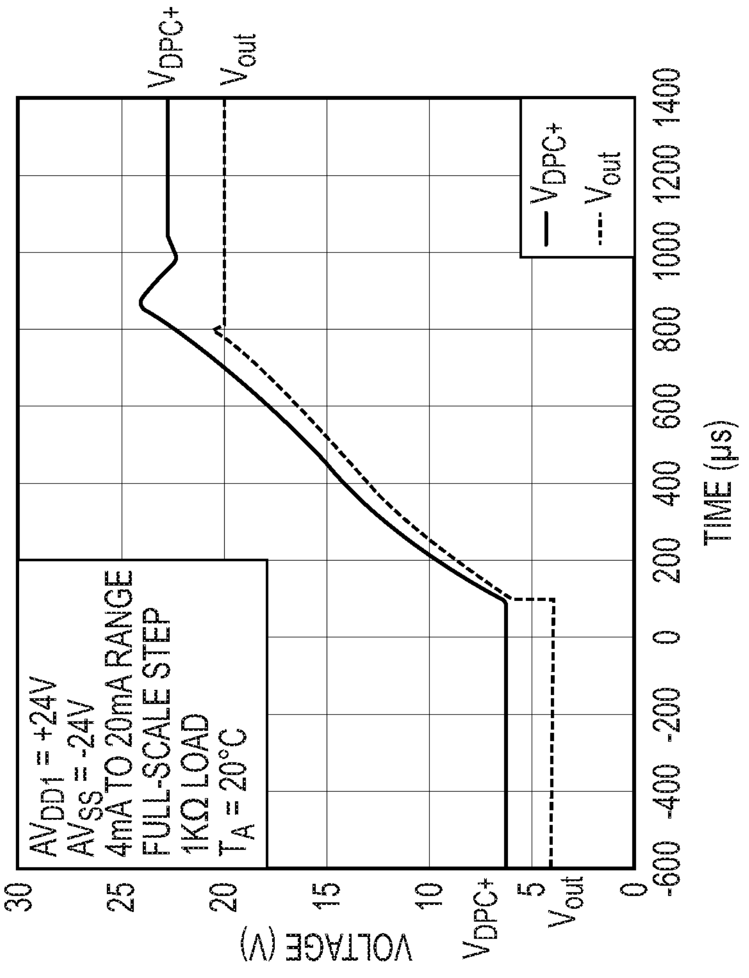
FIG. 2 shows an example of a typical class-H amplifier.
Figure 2:
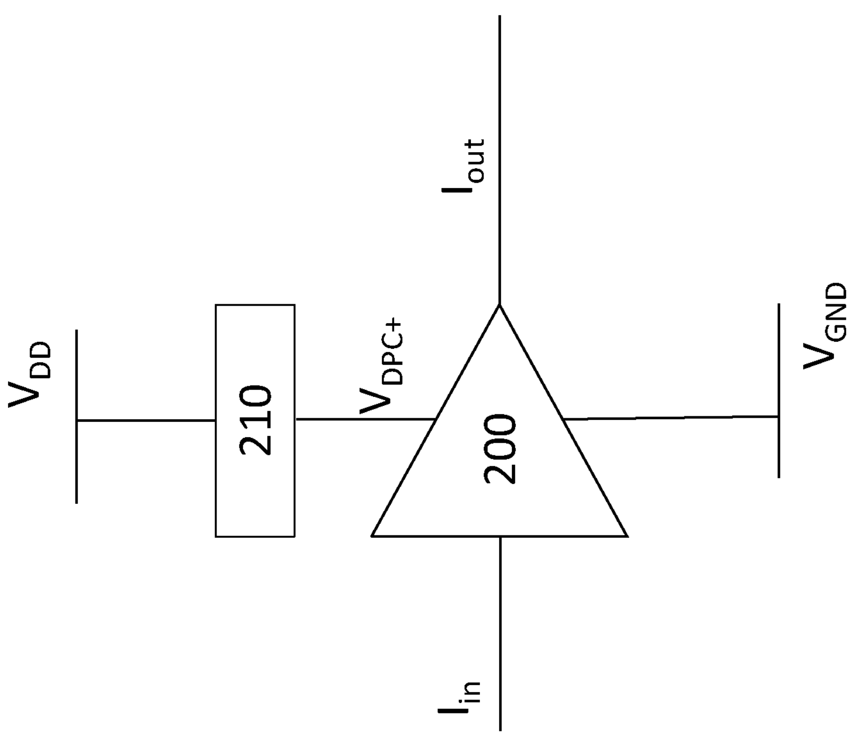

FIG. 2 shows an example of a typical class-H amplifier 200. In this example, the amplifier 200 is a current amplifier that receives an input current $I_{in}$ and amplifies it to generate the amplified output current $I_{out}$. A voltage $V_{out}$ at the output of the amplifier 200 is dependent on $I_{out}$ and the impedance of any load at the output of the amplifier 200 (for example, according to Ohm's law for an ohmic load at the amplifier 200 output). The plot in FIG. 2 shows $V_{out}$ changing over time. In this example, the load at the amplifier 200 output remains constant so that as $I_{out}$ increases (between time=100 us to time=800 us), $V_{out}$ proportionally increases. The supply controller 210 is configured to adjust the supply voltage $V_{DD}$ to set the power supply voltage $V_{DPC+}$ used by the amplifier 200 so that it always tracks the output voltage $V_{out}$ of the amplifier 200 (for example, by reducing the voltage $V_{DD}$ by an amount that is dependent on $V_{out}$). In the example shown in the plot, the supply controller 210 is configured to use the fixed supply voltage $V_{DD}$ to set $V_{DPC+}$ to track a predetermined amount above $V_{out}$ (in this particular example, about 2V above) so as to maintain a headroom voltage (i.e., set $V_{DPC+}$ to be $V_{out+}$ the predetermined headroom voltage).

Figure 3A:
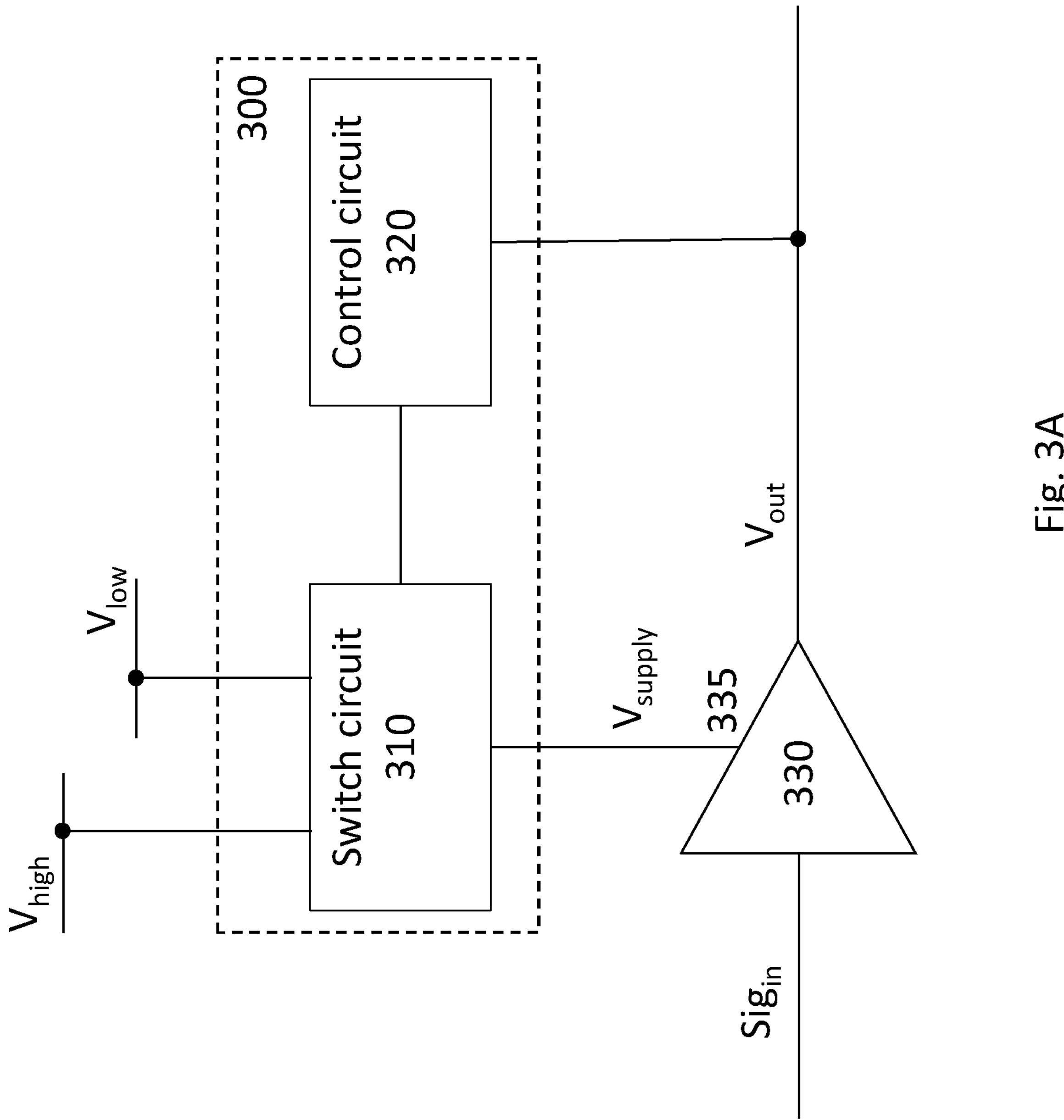
FIG. 3A shows an example schematic diagram of a voltage supply circuit according to an aspect of the present disclosure.

FIG. 3A shows an example schematic diagram of a voltage supply circuit 300 in accordance with an aspect of the present disclosure. The voltage supply circuit 300 is configured to set an amplifier supply voltage $V_{supply}$ at a power supply terminal 335 of an amplifier 330 based on the output voltage $V_{out}$ of the amplifier 330. The amplifier 330 may be a current or voltage amplifier, such that the input signal $Sig_{in}$ may be a current or voltage signal, i.e. $I_{in}$ or Vin and the output signal a corresponding amplified current or voltage signal, $I_{out}$ or $V_{out}$. In the case of a current amplifier, the output voltage $V_{out}$ will be dependent on $I_{out}$ and the impedance of any load at the output of the amplifier 330 (not shown in FIG. 3). For example, for a purely ohmic load R, the voltage $V_{out}$ would be equal to $I_{out}$*R.

The voltage supply circuit 300 comprises a switch circuit 310 arranged to set the power supply voltage 335 using the two supply voltages $V_{high}$ and $V_{low}$. For example, the two supply voltages $V_{high}$ and $V_{low}$ may be fixed power supply voltages, for example voltage rails, to which the circuit 300 can be connected. The first supply voltage $V_{high}$ is greater than the second supply voltage $V_{low}$. By way of non-limiting example, the first supply voltage $V_{high}$ may be set to 28V and the second supply voltage $V_{low}$ may be set to 12V, or the first supply voltage $V_{high}$ may be set to 20V and the second supply voltage $V_{low}$ may be set to 10V, or the first supply voltage $V_{high}$ may be set to 12V and the second supply voltage $V_{low}$ may be set to 5V, etc.

The voltage supply circuit 300 also comprises a control circuit 320 that is configured to control the switch circuit 310, using the amplifier output voltage $V_{out}$, to set the amplifier supply voltage $V_{supply}$. In this way, the control circuit 320 can control the switch circuit 310 to set the amplifier supply voltage $V_{supply}$ to a voltage that is between $V_{low}$ and $V_{high}$ (inclusive) in dependence on $V_{out}$.

Figure 3B:
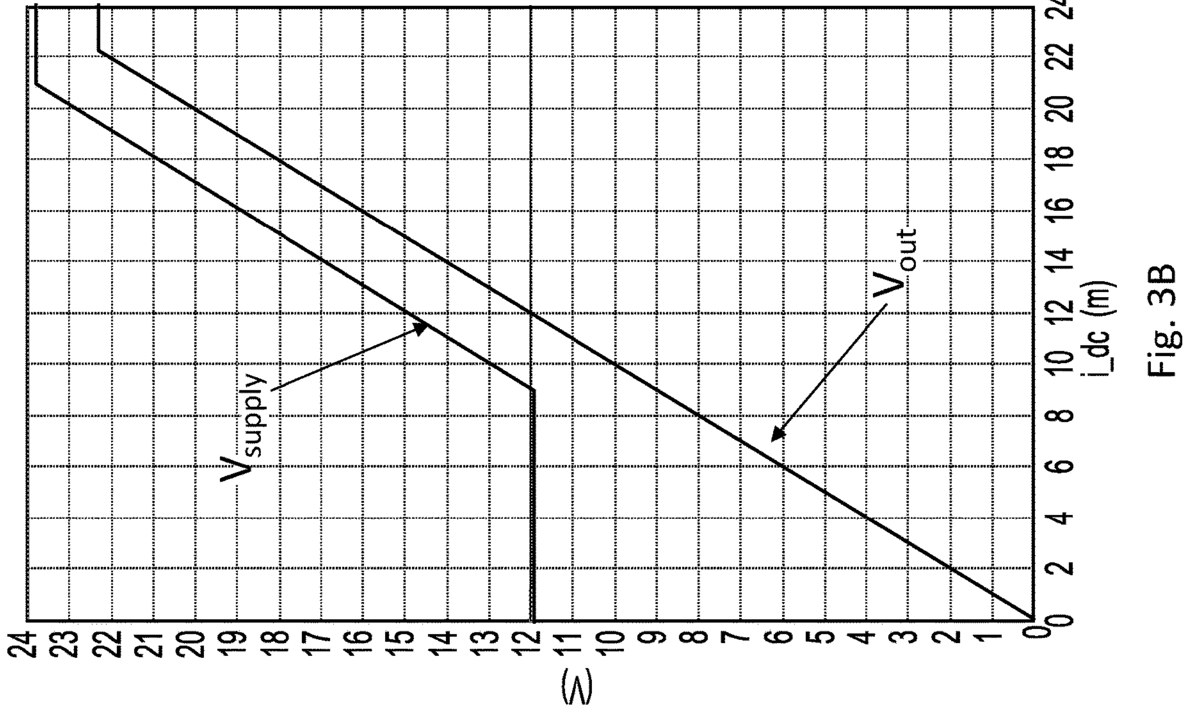
FIG. 3B shows an example plot representing the operation of the voltage supply circuit of FIG. 3A.

FIG. 3B shows an example plot representing how the voltage supply circuit 300 may be configured to set the amplifier supply voltage $V_{supply}$ in dependence on $V_{out}$. In this example, the amplifier 330 is a current amplifier, so the x-axis represents the output current $I_{out}$ in mA. The amplifier output load is assumed to be assumed to be a fixed 1 kΩ, so that as $I_{out}$ increases from 0 mA to 22 mA, $V_{out}$ correspondingly increases from 0V to 22V (as can be seen from the voltage units on the y-axis of the plot). The voltage supply circuit 300 is configured to maintain at least a predetermined headroom voltage $V_{headroom}$ between $V_{out}$ and $V_{supply}$, which in this example is 3V (although $V_{headroom}$ could be any desired voltage, or in some examples could be eliminated altogether, eg $V_{headroom}$=0V). In this example, $V_{low}$ is 12V and $V_{high}$ is 24V, although they may be any other suitable power supply voltage.

As can be seen from the plot, when $V_{out}+V_{headroom}$ is less than $V_{low}$, the voltage supply circuit 300 is configured to set $V_{supply}$ to substantially equal $V_{low}$ (eg, 12V). When $V_{out}+V_{headroom}$ is greater than $V_{low}$, the voltage supply circuit 300 is configured to set $V_{supply}$ to track $V_{out}$. In this particular example, because the voltage supply circuit 300 is configured to maintain at least a predetermined headroom voltage $V_{headroom}$, $V_{supply}$ is set to track $V_{out}+V_{headroom}$ (i.e., $V_{supply}$ is set to equal $V_{out}+V_{headroom}$). In an alternative, where no headroom voltage is desired, when $V_{out}$ is greater than $V_{low}$, the voltage supply circuit 300 may be configured to set $V_{supply}$ to equal $V_{out}$. Throughout this disclosure the term "tracking voltage" is used, which is $V_{out}+V_{headroom}$ when a headroom voltage is desired, or is equal simply to $V_{out}$ when no headroom voltage is desired.

By setting $V_{supply}$ based on $V_{out}$ in this way, the voltage supply circuit 300 and amplifier 330 may be implemented more straightforwardly, and therefore more cost-effectively, than typical class-G and class-H amplifiers (as will be appreciated from the details later in this disclosure). In particular, because the voltage supply circuit 300 is separate, or decoupled, from the amplifier 330 and is configured simply to set the supply voltage provided to the amplifier 330, more design freedom is afforded to the amplifier 330 compared with some class-G amplifiers where control of the power supply level is performed within the amplifier circuit itself. Such implementations of class-G amplifiers tend to increase the design complexity, and reduce design freedom, for the amplifier gain stages. It also means that the voltage supply circuit 300 may be used in combination with existing amplifiers, enabling those amplifiers to realise an improvement in efficiency without requiring any redesign. Also, because the implementation may be relatively straightforward, it is possible to integrate the voltage supply circuit 300 and amplifier 330 within a small area of silicon.

Furthermore, amplifier glitch immunity may be improved compared with class-G amplifiers. This is because the supply voltage does not hard switch between two different levels and instead smoothly transitions from $V_{low}$ to track $V_{out}$ when the tracking voltage increases to become greater than $V_{low}$ (as can be seen in FIG. 3B). Likewise, it smoothly transitions from tracking $V_{out}$ to a fixed level $V_{low}$ when the tracking voltage decreases to become less than $V_{low}$ (as, again, can be seen in FIG. 3B). For example, if $V_{out}+V_{headroom}$ is at around the level of $V_{low}$, perhaps evens slightly oscillating above and below $V_{low}$, there should not be any significant glitches or distortions in $V_{out}$ caused by amplifier supply voltage changes, since there are no significant discontinuities in $V_{supply}$, in contrast to the hard switching of typical class-G amplifiers. This is most apparent when operating the amplifier in HART mode where a varying signal, such as a 1.2 kHz/2.2 kHz frequency shift key (FSK) signal, is imposed on top of a DC Vin signal. Depending on the DC bias point, transition between supply voltages $V_{low}$ and $V_{high}$ may take place during each cycle of the HART waveform. In a traditional class-G amplifier, such regular voltage supply switching might cause problematic glitches in $V_{out}$, but with the voltage supply circuit 300 of the present disclosure, any glitches in the $V_{out}$ signal are sufficiently small as to be acceptable.

Finally, amplifier linearity may be improved compared with some class-G designs. In particular, in some class-G designs, the biasing of key devices within the gain stages of the amplifier changes when the supply voltage is changed. Such changes in bias tends to promote amplifier non-linearities. In contrast, because of the operation of the voltage supply circuit 300 of the present disclosure, the biasing conditions of key devices within the amplifier 330 may remain substantially unchanged when $V_{supply}$ changes. As a result, amplifier linearity may be improved.

Figure 4:
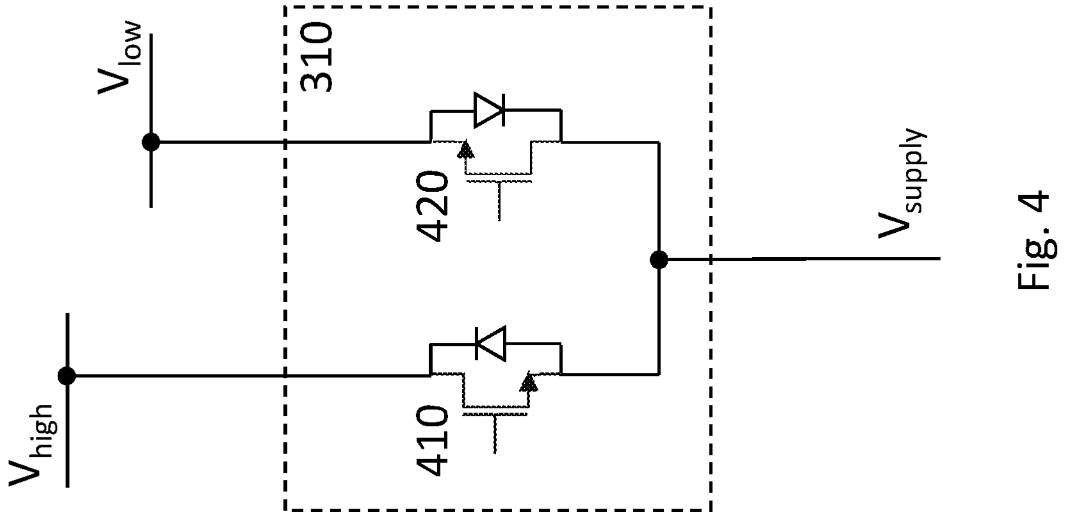
FIG. 4 shows a schematic diagram of an example implementation of the switch circuit of the voltage supply circuit of FIG. 3A.

FIG. 4 shows one example implementation of the switch circuit 310. In this example, the switch circuit comprises a first transistor 410 arranged to switchably couple the first supply voltage $V_{high}$ to the supply terminal 335 of the amplifier 330, and a second transistor 420 arranged to switchably couple the second supply voltage $V_{low}$ to the supply terminal 335 of the amplifier 330. The diodes represented in FIG. 4 are the body diodes of the two transistors, rather than discrete diode components. In this example, the transistors are n-type MOSFETs, for example n-type LDMOS transistors.

Figure 5:
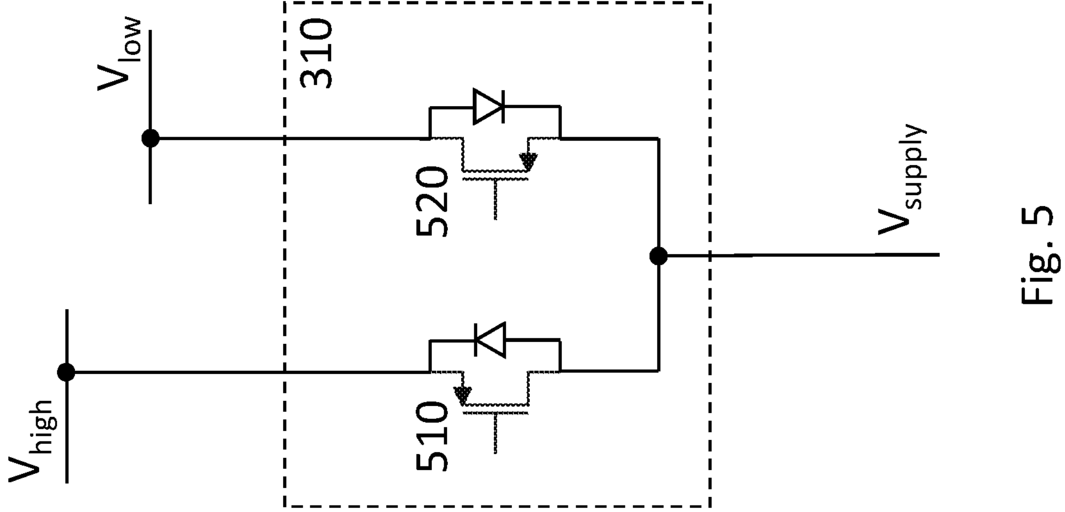
FIG. 5 shows an example schematic diagram of an example alternative implementation of the switch circuit of the voltage supply circuit of FIG. 3A.

FIG. 5 shows an alternative implementation of the switch circuit 310. In this example, the switch circuit comprises a first transistor 510 and a second transistor 520. These two transistors are arranged similarly to that of the FIG. 4 example, and perform the same function, but are instead p-type MOSFETs, for example p-type LDMOS transistors. The voltage supply circuit 300 of the present disclosure may be implemented with either of the switch circuits 310 represented in FIGS. 4 and 5. Both implementations of the switch circuit 310 are beneficial designs in that they each only include two transistors, which minimises cost, complexity and space. The n-type implementation of FIG. 4 is particularly space efficient and can be implemented in an even smaller area than that of the p-type implementation of FIG. 5. However, both designs are very effective and the choice of which to use may be based on design requirements.

In these examples, as explained in more detail later, the control circuit 320 is configured to turn the first transistor 410, 510 off and turn the second transistor 420, 520 on when the tracking voltage is less than $V_{low}$, so as to set $V_{supply}$ to substantially equal $V_{low}$. The control circuit 320 is also configured, when the tracking voltage is greater than $V_{low}$, to turn the second transistor 420, 520 off and turn the first transistor 410, 510 on by an amount such that $V_{supply}$ is set to equal the tracking voltage. In both examples, the first transistor 410, 510 and the second transistor 420, 520 are coupled to each other in anti-series. In particular, in the example of FIG. 4 the source of the first transistor 410 is coupled to the drain of the second transistor 420, and in the example of FIG. 5 the drain of the first transistor 510 is coupled to the source of the second transistor 520. As a result, when $V_{supply}$ is greater than $V_{low}$, which is the case when the target voltage is greater than $V_{low}$, the body diode of the second transistor 420, 520, is reverse biased and so blocks current flowing from $V_{supply}$ to $V_{low}$. As a result, a short circuit between $V_{high}$ to and $V_{low}$ is prevented, thereby avoiding current flowing from $V_{high}$ to $V_{low}$.

Figure 6:
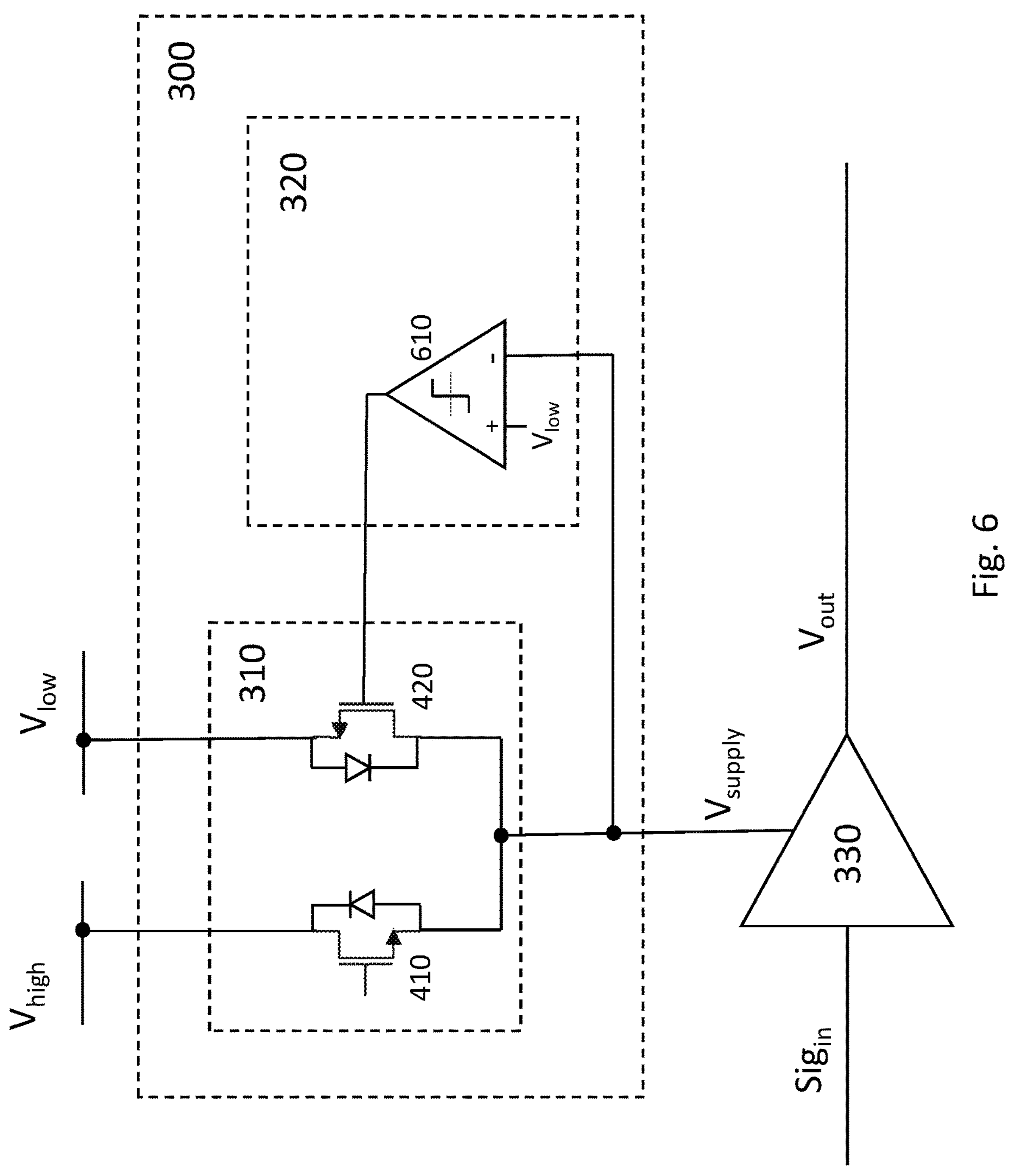
FIG. 6 shows a schematic diagram of an example of part of the control circuit of the voltage supply circuit of FIG. 3A.

FIGS. 6 to 11 show different details of the control circuit 320 in combination with the n-type switch circuit of FIG. 4. FIG. 6 shows an example detail of a part of the control circuit 320 arranged to control the second transistor 420 so as it turn it fully on when the tracking voltage is less than $V_{low}$ and turn it off when the tracking voltage is greater than $V_{low}$. For this purpose, the control circuit 320 comprises a second operational amplifier (op amp) 610 (a 'first' operational amplifier will be described later). The second op amp 610 is arranged to receive the amplifier supply voltage $V_{supply}$ at a first input and $V_{low}$ at a second input. The output of the second op amp 610 is coupled to the control terminal (i.e., the gate) of the second transistor 420. When $V_{low}$ is greater than $V_{supply}$, the output of the second op amp 610 goes high (for example, it equals the high side supply voltage of the second op amp 610—not shown in FIG. 6 for the sake of simplicity). When $V_{low}$ is less than $V_{supply}$, the output of the second op amp 610 goes low (for example, it equals the low side supply voltage of the second op amp 610, such as ground—not shown in FIG. 6 for the sake of simplicity). As a result, the second transistor 420 should turn fully on when $V_{supply}$ is less than $V_{low}$ and fully off when $V_{supply}$ is greater than $V_{low}$. As will be understood from the explanation of the control of the first transistor 410 provided later in this disclosure, when the tracking voltage is greater than $V_{low}$, $V_{supply}$ is set to equal the tracking voltage. When the tracking voltage is less than $V_{low}$ and the first transistor 410 is fully turned off, $V_{supply}$ should in practice be fractionally less than $V_{low}$ owing to the on-state resistance of the second transistor 420. As a result, all the time that the tracking voltage is less than $V_{low}$, the second transistor should be maintained by the second op amp 610 in a fully on state. Therefore, it will be appreciated that throughout the disclosure it is said that when the tracking voltage is less than $V_{low}$, $V_{supply}$ is set to substantially equal $V_{low}$, which should be interpreted to mean that $V_{supply}$ is set to equal $V_{low}$ less any voltage drop caused by components coupled between the amplifier supply terminal 335 and the voltage $V_{low}$. Consequently, it can be seen that whilst the inputs of the second op amp 610 are $V_{supply}$ and $V_{low}$, because of the related operation of the first op amp, the second op amp 610 effectively operates to turn on the second transistor 420 when the tracking voltage is less than $V_{low}$ and turn off the second transistor 420 when the tracking voltage is greater than $V_{low}$.

Figure 7:
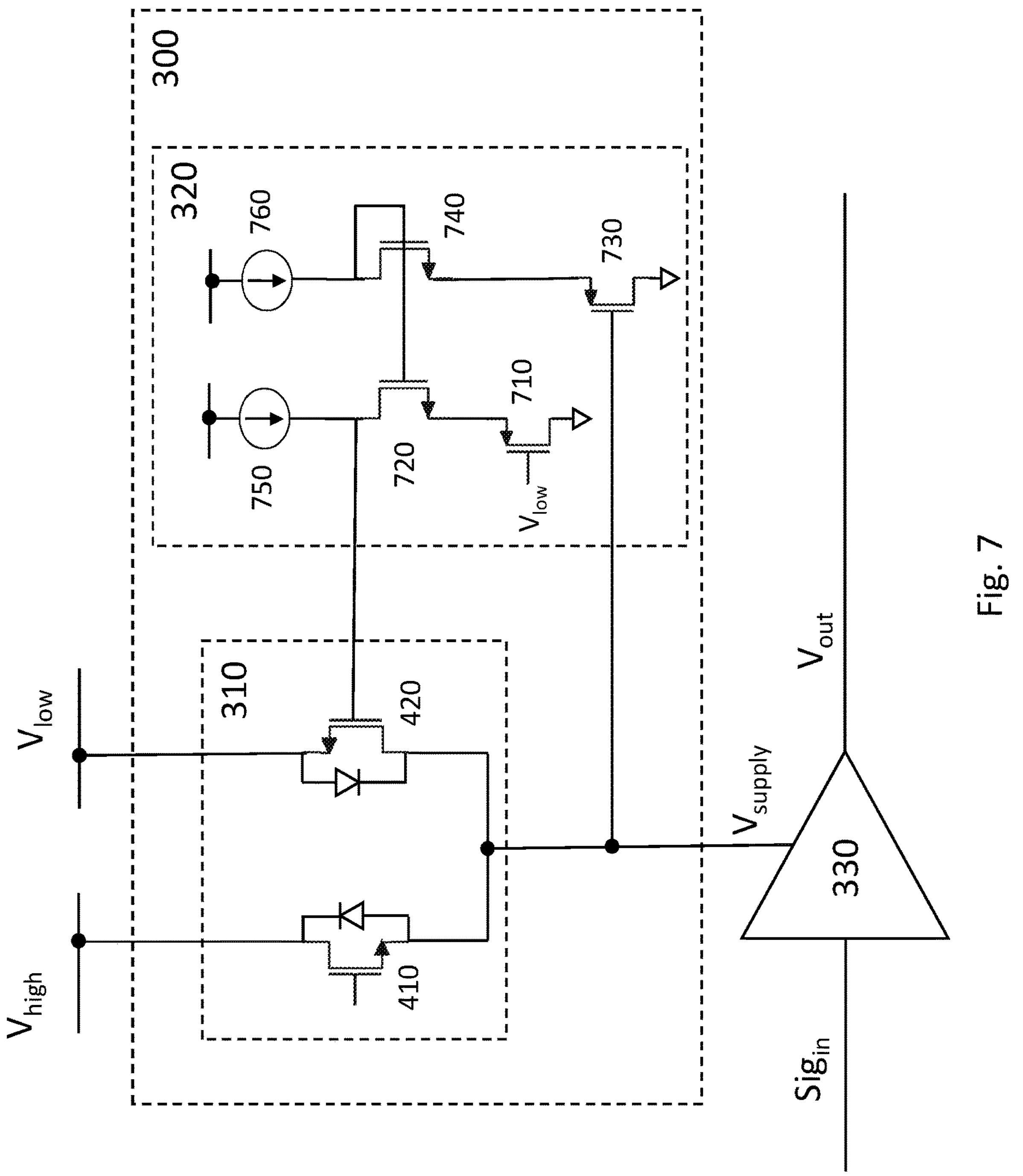
FIG. 7 shows an example implementation of the part of the control circuit represented in FIG. 6.

FIG. 7 shows one example implementation of the second op amp 610. As can be seen, the second op amp in this example implementation comprises four transistors 710, 720, 730 and 740, for example four MOSFETs such as LDMOS transistors, and two current sources 750 and 760, which may be of any suitable design that will be well known to the skilled person. Any other suitable op amp implementation may alternatively be used.

Figure 8:
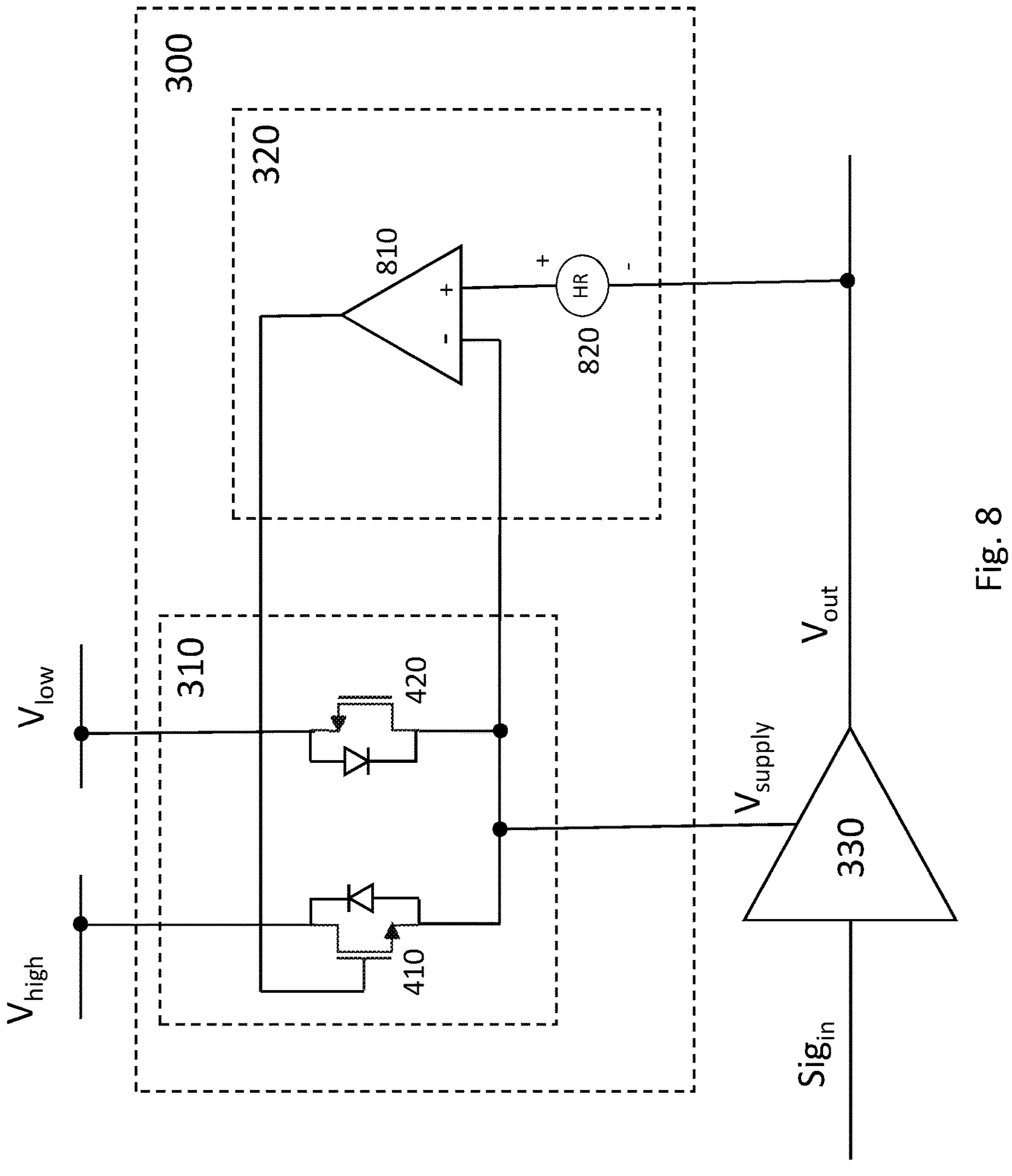
FIG. 8 shows a schematic diagram of an example of a further part of the control circuit of the voltage supply circuit of FIG. 3A.

FIG. 8 shows an example detail of another part of the control circuit 320. This part of the control circuit 320 is arranged to control the first transistor 410 so as to turn it fully off when the tracking voltage is less than $V_{low}$ and, when the tracking voltage is greater than $V_{low}$, turn it on by an amount that is sufficient to set $V_{supply}$ to equal the tracking voltage. For this purpose, the control circuit 320 comprises a first operational amplifier (op amp) 810 that is arranged to receive the amplifier supply voltage $V_{supply}$ at a first input and the tracking voltage ($V_{out}$+$V_{headroom}$) at a second input. The control circuit 320 also comprises a headroom voltage generator 820 configured to add a predetermined headroom voltage $V_{headroom}$ (such as 1V, 2V, 3V, etc) to $V_{out}$ so as to set the tracking voltage at the input to the second op amp 810. The headroom voltage generator 820 may be implemented in any suitable way, an example of which is given later in this disclosure. As explained earlier, the headroom voltage generator 820 is optional and, if omitted, the control circuit 320 may be arranged such that the first input of the first op amp 810 receives the voltage $V_{out}$, such that the tracking voltage is $V_{out}$.

The output of the first op amp 810 is coupled to the control terminal (i.e., the gate) of the first transistor 410. When the tracking voltage is less than $V_{supply}$, the output of the first op amp 810 goes low (for example, it equals the low side supply voltage of the first op amp 810, such as ground—not shown in FIG. 8 for the sake of simplicity). As explained earlier with reference to FIG. 6, when the tracking voltage is less than $V_{low}$, the second transistor 420 is controlled to be fully turned on to set $V_{supply}$ to substantially equal $V_{low}$. Therefore, it can be seen that whilst the tracking voltage is less than $V_{low}$, $V_{supply}$ should be substantially equal $V_{low}$, resulting in the output of the first op amp 810 being low and the first transistor 410 therefore being turned off. When the tracking voltage is equal to or greater than $V_{supply}$, the arrangement of the first op amp 810 effectively forms a servo-loop with the first transistor 410. As will be well understood by the skilled person, op amps are configured to set their output voltage to any voltage between the op amp supply rails in an effort to make the two input voltages equal. Therefore, as the tracking voltage increases to equal or be greater than $V_{low}$ and the second transistor 420 is turned off, the first op amp 810 will set an output voltage that results in the first transistor 410 being turned on by an amount necessary to set $V_{supply}$ to equal the tracking voltage (up to an operational limit of the tracking voltage equaling $V_{high}$). Therefore, it can be seen that when the tracking voltage is greater than $V_{low}$ (but less than or equal to $V_{high}$), the voltage supply circuit 300 is arranged to set $V_{supply}$ to a voltage between $V_{low}$ and $V_{high}$ that tracks $V_{out}$, as represented in the plot of FIG. 3B.

Figure 9:
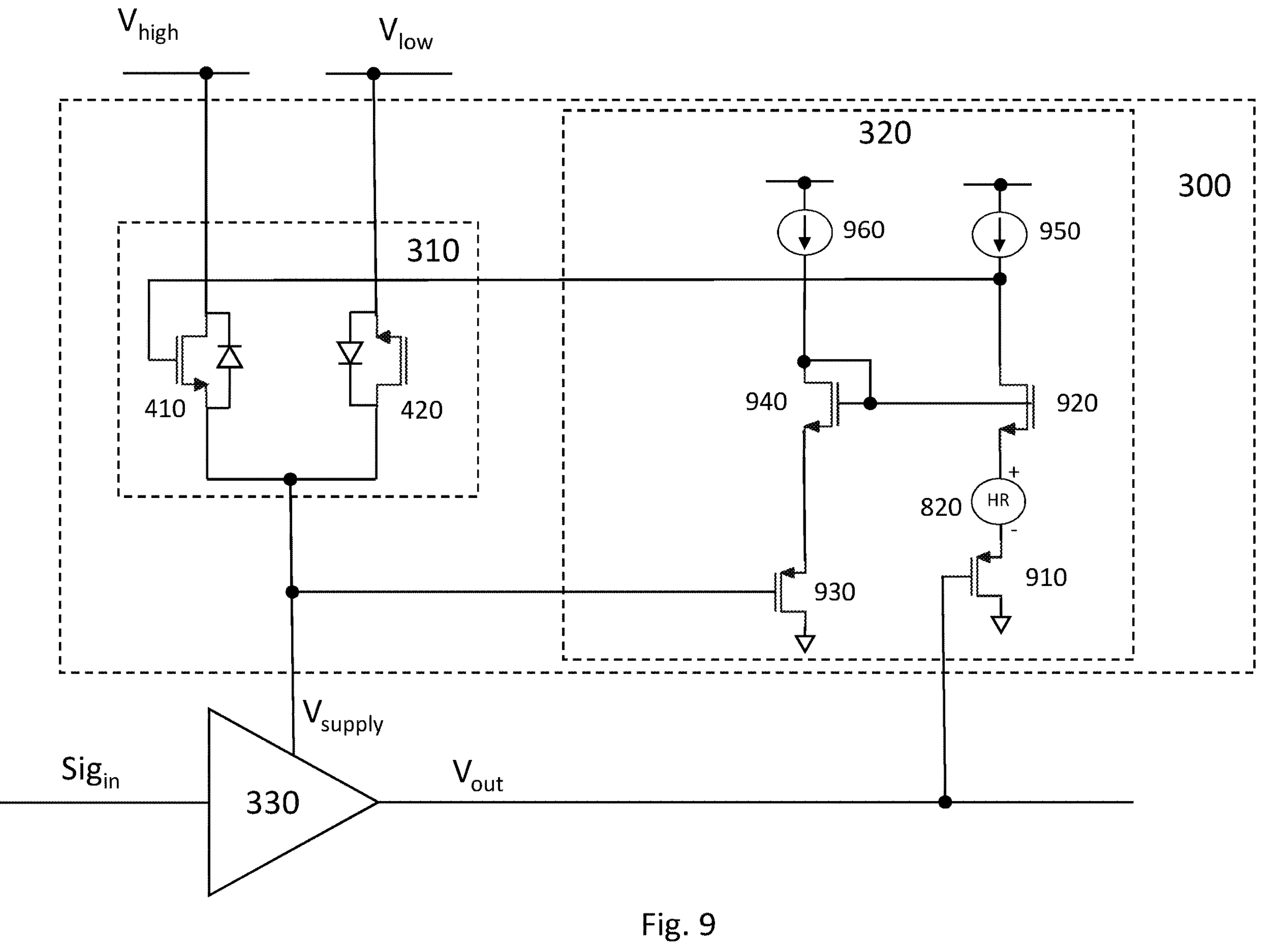
FIG. 9 shows an example implementation of the part of the control circuit represented in FIG. 8.

FIG. 9 shows one example implementation of the first op amp 810. As can be seen, the first op amp 810 in this example implementation comprises four transistors 910, 920, 930 and 940, for example four MOSFETs such as LDMOS transistors, and two current sources 950 and 960, which may be of any suitable design that will be well known to the skilled person. Any other suitable op amp implementation may alternatively be used.

Figure 10:
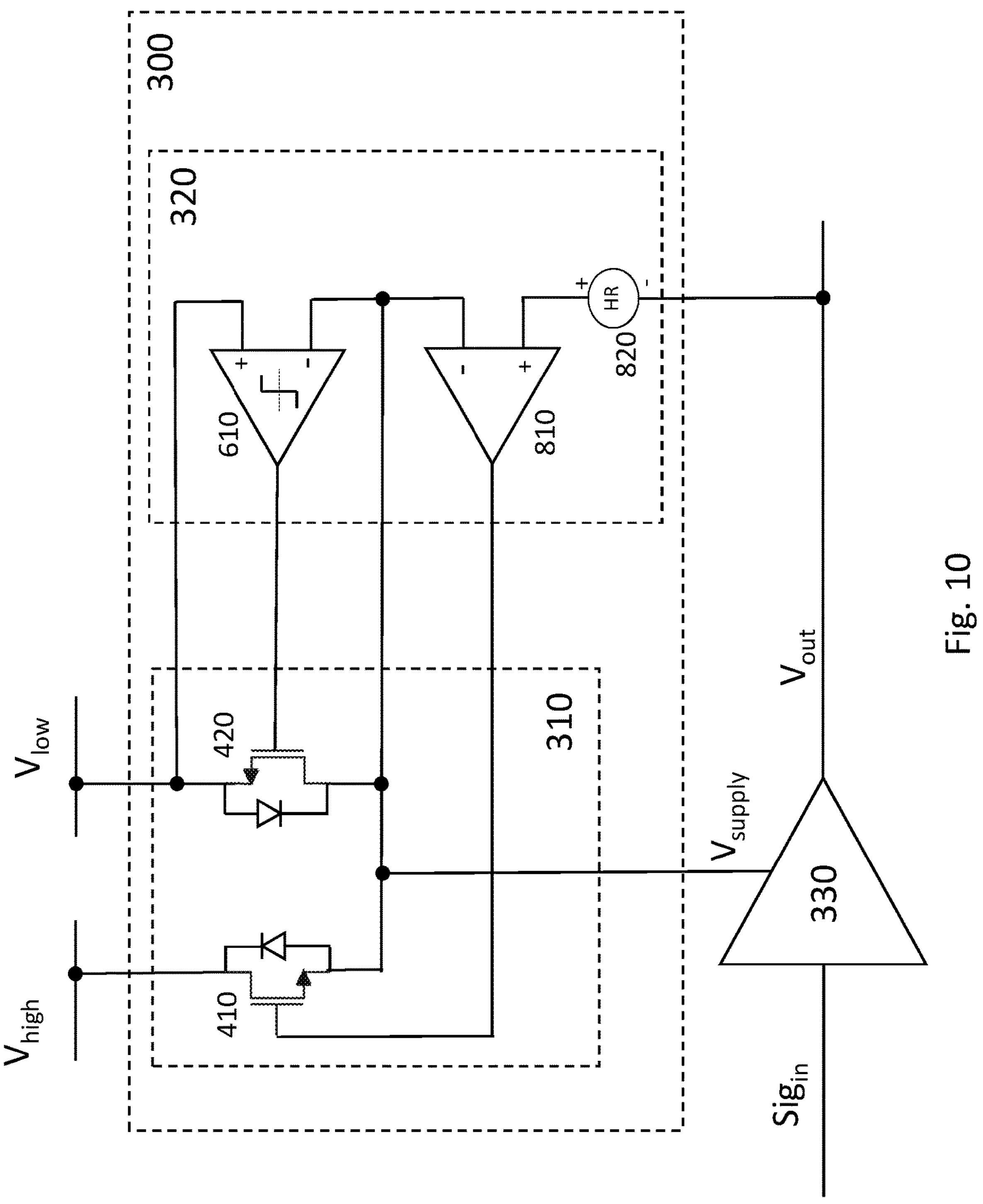
FIG. 10 shows a schematic diagram of an example implementation of the control circuit of the voltage supply circuit of FIG. 3A.

FIG. 10 shows a representation of the control circuit 320 that includes both the first op amp 810 and the second op amp 610 that are arranged to operate as described above. As explained above, and as will be appreciated from FIG. 10, when the tracking voltage is less than $V_{low}$, the first op amp 810 output is a low voltage that fully turns off the first transistor 410 and the second op amp 610 output is a high voltage that fully turns on the second transistor 420 such that $V_{supply}$ is set to substantially equal $V_{low}$. If $V_{out}$ increases such that the tracking voltage is greater than $V_{low}$, the first op amp 410 will turn on the first transistor 410 by an amount such that the first transistor 410 uses $V_{high}$ to set $V_{supply}$ to equal the tracking voltage. Since the tracking voltage, and therefore $V_{supply}$, is greater than $V_{low}$, the output of the second op amp 610 will turn the second transistor 420 completely off to decouple the amplifier supply terminal 335 from $V_{low}$. There may be a time, for example when the tracking voltage equals $V_{low}$, that both the first transistor 810 and the second transistor 610 are on. However, this is not a problem since, as a result of the arrangement of the voltage supply circuit 300, the moment that the tracking voltage increases such that the first transistor 410 increases $V_{supply}$ to be greater than $V_{low}$, the second transistor 420 is turned off to decouple $V_{low}$, and the body diode of the second transistor 420 is reverse biased to prevent current flowing to $V_{low}$. Therefore, the moment conditions are such that current could potentially flow from $V_{high}$ to $V_{low}$, the second transistor 420 acts to prevent it. As a result, during a scenario like this, current to the amplifier 330 is being shared between $V_{high}$ and $V_{low}$, but no current flows from $V_{high}$ to $V_{low}$. Likewise, the moment the tracking voltage goes down below $V_{low}$, the first transistor 410 is turned off and the supply voltage $V_{supply}$ is set to a steady voltage $V_{low}$ by the second transistor 420. Again, for a time the first transistor 410 and the second transistor 420 may both be on, but during this time $V_{high}$ and $V_{low}$ may share the supply of current to the amplifier 330, with the second transistor 420 being turned off before conditions exist for current to flow from $V_{high}$ to $V_{low}$. Therefore, the voltage supply circuit 300 is configured to stably set the supply voltage $V_{supply}$ to substantially equal $V_{low}$ for low values of $V_{out}$ and then smoothly transition to tracking $V_{out}$ when the tracking voltage increases to be greater than $V_{low}$, and likewise as $V_{out}$ decreases from a high value to a low value, smoothly transition from tracking $V_{out}$ to then be a fixed value substantially equal to $V_{low}$. Optionally, a finite amount of hysteresis may also be employed in the control circuit 320 to help address any offsets relating to mismatch of transistors, etc.

Figure 11:
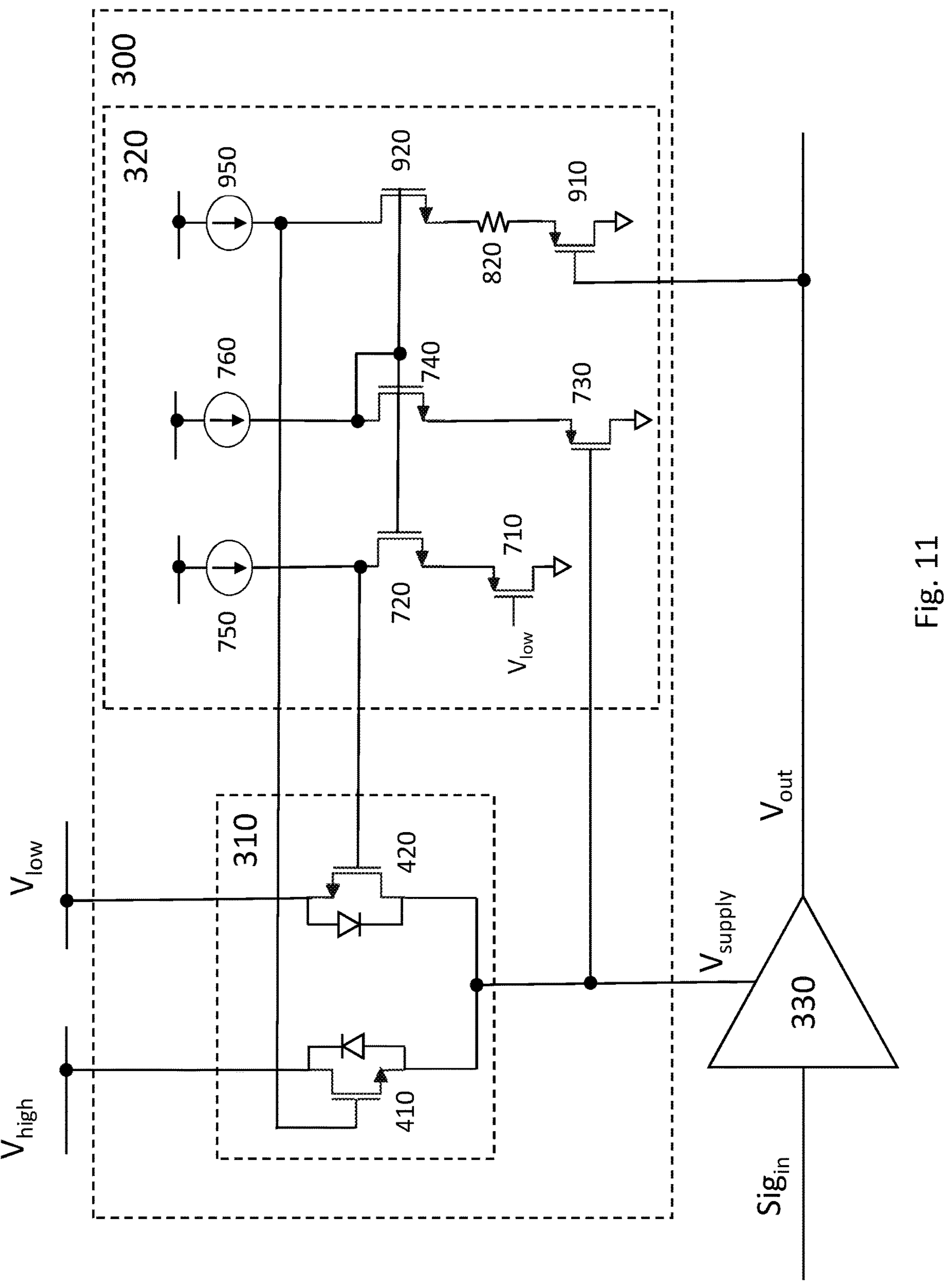
FIG. 11 shows an example implementation of the control circuit represented in FIG. 10.

FIG. 11 shows one example implementation of the first op amp 810 and second op amp 610. As can be seen, owing to the symmetry of the two op amps, some of the components can perform functions within both the first op amp 810 and the second op amp 610 (in particular, transistors 730 and 740, and current source 760, perform the same function as transistors 930 and 940 and current source 960), such that the two op amps can be conceptually made up from a combined total of six transistors and three current sources. This further improves the space efficiency of the voltage supply circuit 300 and also reduces costs and power consumption, particularly for high voltage designs (i.e., where the magnitude of $V_{high}$ is relatively large in order to handle relatively large magnitudes of $V_{out}$, for example where $V_{high}$ is greater than 15V, or greater than 20V). The headroom voltage generator 820 in this example is implemented by a resistor between two of the transistors of the first op amp 810.

It will be appreciated that in order for the first transistor 410 to set $V_{supply}$ to an upper limit of $V_{high}$ high, the first op amp 810 would need to be capable of driving the gate of the first transistor 410 to a voltage that is greater than $V_{high}$ (because of the turn-on threshold voltage of the first transistor 410). To achieve this, the high-side voltage supply of one or more of the current sources of the first op amp 810 (and optionally all of the current sources shown in FIG. 11) may be supplied by a voltage that is greater than $V_{high}$. This may be achieved in a variety of different ways, for example using a three voltage rail that is greater than $V_{high}$ (is available), or by using one or more charge pumps that may take the voltage $V_{high}$ and increase it by an amount that is greater than or equal to the turn on threshold of the first transistor 410, for example 4V, in order to supply power to the current sources, etc. Such an arrangement is optional and the current sources may alternatively be supplied power directly from $V_{high}$, although this means that the maximum possible amplifier supply voltage $V_{supply}$ will be $V_{high}$ less the turn-on voltage of the first transistor 410. This may limit the range of output voltages $V_{out}$ over which the voltage supply circuit 300 can operate to track $V_{out}$.

Figure 12:
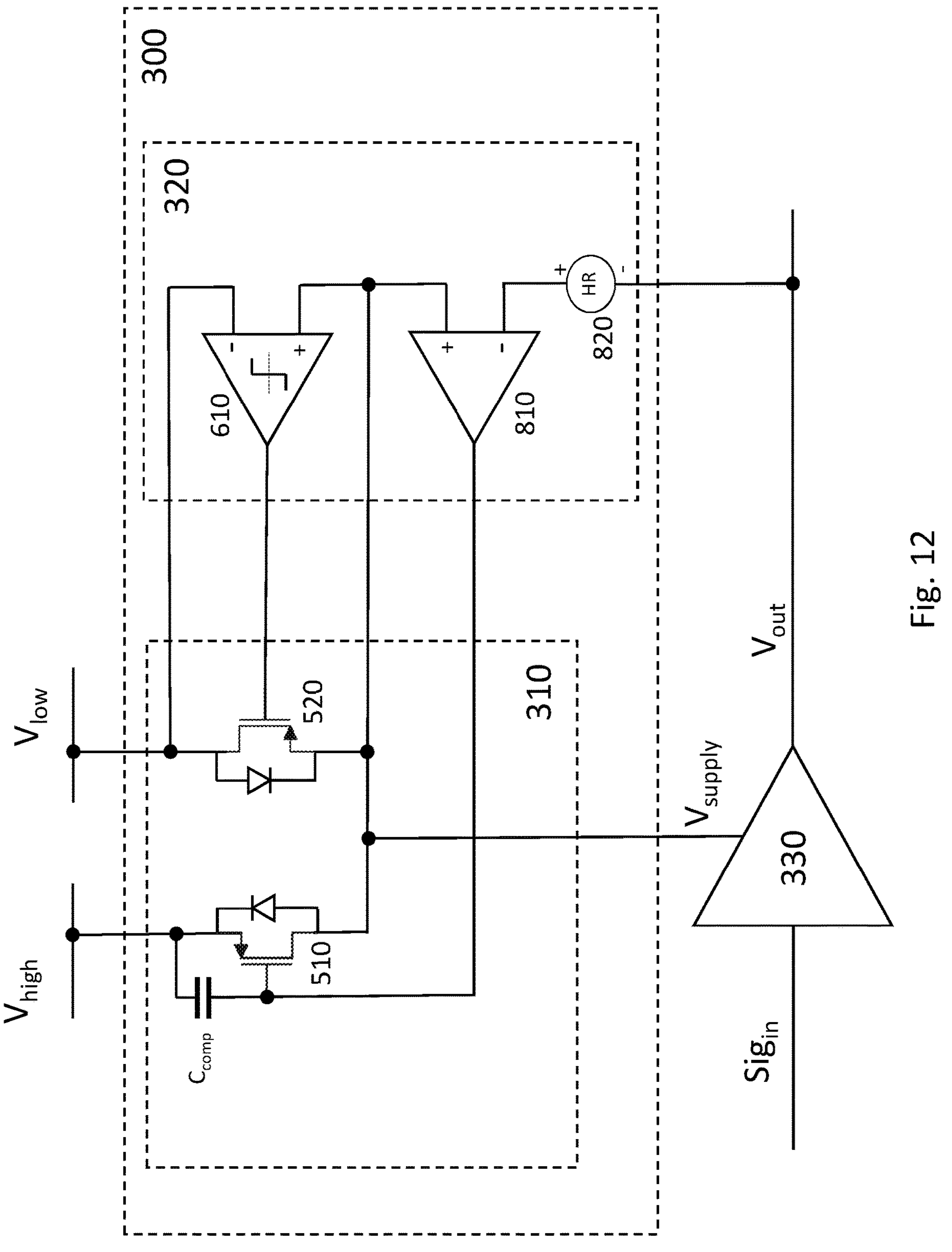
FIG. 12 shows a schematic diagram of an alternative example of the voltage supply circuit of FIG. 3A.

FIG. 12 shows an example implementation of the control circuit 320 when the switch circuit comprises p-type transistors. It can be seen that this example is very similar to that of FIG. 10, except that the polarity of the inputs to the first op amp 810 and the second op amp 610 have been reversed. Furthermore, optionally a capacitor $C_{comp}$ may be used to couple the control terminal of the first transistor 510 to $V_{high}$ in order to help compensate the servo loop formed by the first transistor 510 and the first op amp 810 given the higher effective gain of the first transistor 510. The state of the first transistor 510 can be controlled by the first op amp 810 as described earlier. A transistor level diagram of the control circuit 320 (equivalent to FIG. 11) is not included in the Figures for the sake of simplicity and efficiency, but the skilled person will readily appreciate from FIGS. 7, 9 and 11 how to implement the first op amp 810 and second op amp 610 represented in FIG. 12.

Optionally, the control circuit 320 may be further configured to enable a locked amplifier supply voltage to be set. This functionality may enable a user to lock $V_{supply}$ to substantially equal $V_{low}$ (by fully turning off the first transistor 410, 510 and fully turning on the second transistor 420, 520) or $V_{high}$ (by fully turning on the first transistor 410, 510 and fully turning off the second transistor 420, 520), regardless of the value of $V_{out}$. This may be achieved, for example, by including additional switches within the control circuit 320 that can be set to decouple at least some of the inputs of op amps 610, 810 from $V_{supply}$ and/or $V_{out}$, and instead couple those inputs to a fixed low voltage (such as ground, or $V_{low}$, or a voltage that is derived from, and smaller than, $V_{low}$, for example using a potential divider) if locking to $V_{low}$ is chosen by the user, or couple them to a fixed high voltage (such as $V_{high}$, or a voltage that is greater than $V_{high}$, for example the voltage used to supply the current sources of the op amps 610, 810) if locking to $V_{high}$ is chosen by the user. Therefore, it can be seen that the voltage supply circuit 300 may be configured to be controllably set to operate in any of: a tracking mode where $V_{supply}$ is set as described with reference to FIG. 3B; a locked low mode where $V_{supply}$ is set to substantially equal $V_{low}$; or a locked high mode where $V_{supply}$ is set to substantially equal $V_{high}$, which may increase the versatility of the voltage supply circuit 300.

Figure 13:
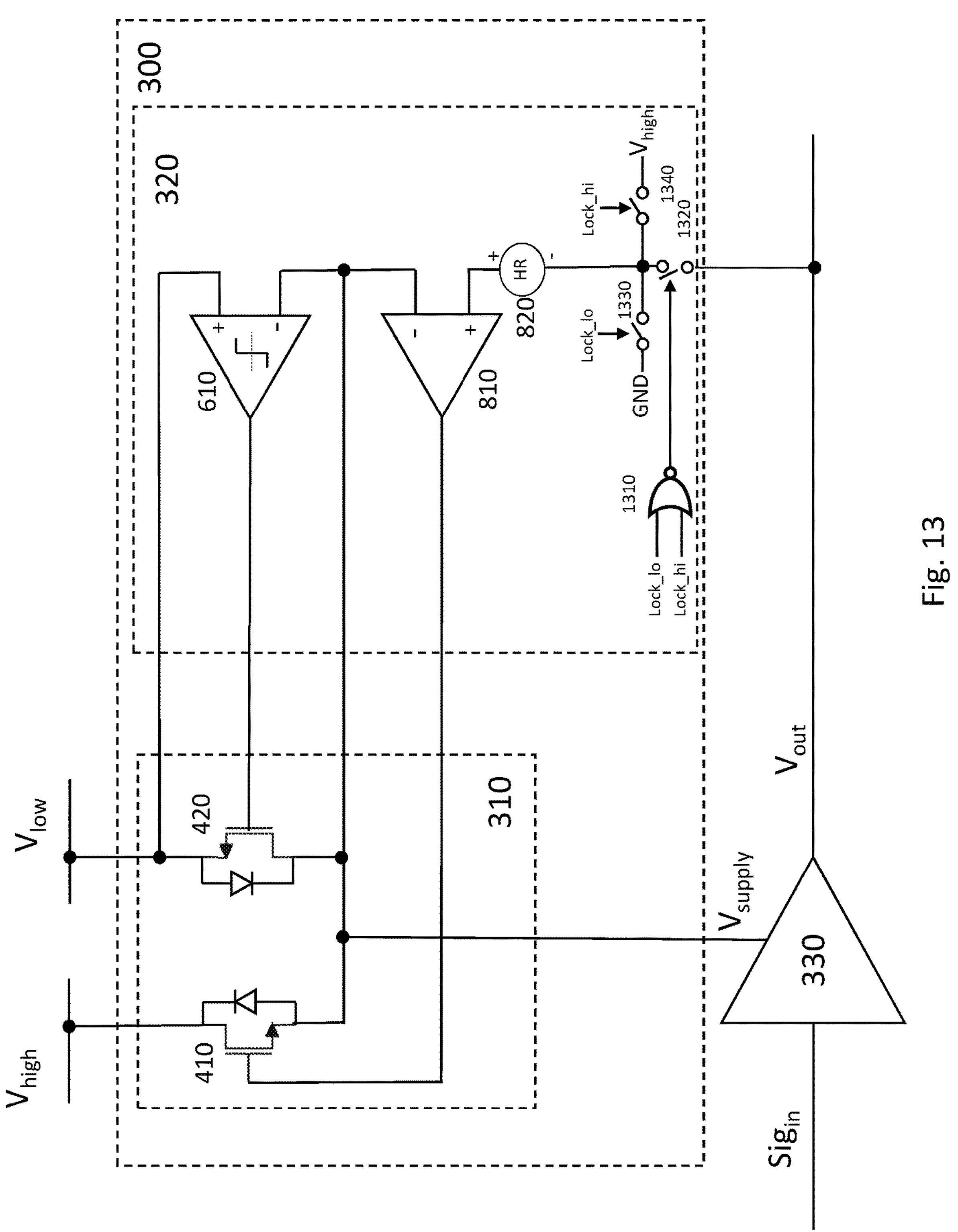
FIG. 13 shows an example schematic diagram of an even further example implementation of the control circuit of the voltage supply circuit of FIG. 3A.

FIG. 13 shows a schematic diagram of one such example where $V_{supply}$ may be locked to $V_{low}$ using the signal Lock_lo, or locked to $V_{high}$ using the signal Lock_hi. In this example, the control circuit 320 further comprises a NOR gate 1310, a first switch 1320, a second switch 1330 and a third switch 1340. The switches may be implemented using any suitable technology, for example transistors such as MOSFETs. The control circuit 320 is configured such that when Lock_lo is a high signal (eg, a digital "1" such as 5V or 12V, etc) and Lock_hi is a low signal (eg, a digital "0", such as 0V), the NOR gate 1310 outputs a low signal to open the first switch 1320 and decouple $V_{out}$ from the first op amp 810. At the same time, the second switch 1330 is closed by the Lock_lo signal so that the input to the first op amp 810 is coupled to ground via the headroom generator 820, such that input to the first op amp 810 is held at the headroom voltage $V_{headroom}$ (or held at ground is the headroom generator 820 is omitted). Consequently, because the headroom voltage is less than $V_{low}$, $V_{supply}$ will be locked at $V_{low}$.

When Lock_hi is a high signal (eg, a digital "1" such as 5V or 12V, etc) and Lock_lo is a low signal (eg, a digital "0", such as 0V), the NOR gate 1310 outputs a low signal to open the first switch 1320 and decouple $V_{out}$ from the first op amp 810. At the same time, the third switch 1340 is closed by the Lock_hi signal so that the input to the first op amp 810 is coupled to $V_{high}$. Consequently, $V_{supply}$ will be locked at $V_{high}$.

When both Lock_lo and Lock_hi are low signals (eg, digital "0" s, such as 0V), the NOR gate 1310 outputs a high signal to close the first switch 1320 to couple $V_{out}$ to the input of the first op amp 810 via the headroom generator 820. Both the second and third switches are held open and the control circuit 320 will operate as described earlier with reference to FIGS. 3 to 12.

In an alternative, the control circuit 320 may be configured such that locking to only $V_{low}$ or $V_{high}$ may be possible. For example, only locking to $V_{high}$ may be possible, in which case the NOR gate 1310 may be omitted along with the second switch 1330, and the first switch 1320 may be controlled directly by Lock_hi. Alternatively, only locking to $V_{low}$ may be possible, in which case the NOR gate 1310 may be omitted along with the third switch 1340, and the first switch 1320 may be controlled directly by Lock_lo.

It will be appreciated that this is merely one example of how the control circuit 320 may be configured to enable it to be set to a voltage tracking mode of operation, in which case it operates as described earlier, or to a locked mode of operation where $V_{supply}$ can be locked to $V_{low}$ or $V_{high}$. In one example, at least one of GND and $V_{high}$ may be coupled via the respective second switch 1330 and third switch 1340 to a point between the headroom generator 820 and the input to the first op amp 810, rather than between the headroom generator 820 and the output of the amplifier 330.

The skilled person will readily appreciate that various alterations or modifications may be made to the above described aspects of the disclosure without departing from the scope of the disclosure.

For example, whilst the voltage supply circuit is configured in the examples to use two supply voltages $V_{low}$ and $V_{high}$ to set the amplifier supply voltage $V_{supply}$, in an alternative three or more supply voltages may be used, for example enabling more fixed levels of voltage for $V_{supply}$ and/or tracking between more voltage ranges.

The above examples show how the positive/high supply voltage of the amplifier 330 may be controlled by the voltage supply circuit 300. Additionally, or alternatively, a voltage supply circuit 300 may be used to control the negative/low supply voltage of the amplifier 330. In one example, the positive/high supply voltage of the amplifier 330 may be controlled by the voltage supply circuit 300 as described above, and the negative/low supply voltage of the amplifier 330 may be held at a fixed level, such as ground (for example, if $Sig_{in}$ will only ever be a positive signal). In an alternative example, the positive/high supply voltage of the amplifier 330 may be held at a fixed level, such as ground and the negative/low supply voltage of the amplifier 330 may be controlled by the voltage supply circuit (for example, if $Sig_{in}$ will only ever be a negative signal). In this case, the magnitude of $V_{high}$ may be greater than that of $V_{low}$ (for example, $V_{high}$ may be −24V and $V_{low}$ may be −12V, or $V_{high}$ may be −15V and $V_{low}$ may be −5V, etc). The voltage supply circuit 300 may be configured similarly to the examples above (but with appropriate polarity and device type changes to the switching circuit 310 and to the control circuit 320) to hold the negative/low supply voltage $V_{supply}$ at $V_{low}$ when the magnitude of the tracking voltage is less than the magnitude of $V_{low}$, and may be configured to set the negative/low supply voltage $V_{supply}$ to equal the tracking voltage when the magnitude of the tracking voltage is greater than the magnitude of $V_{low}$, just as described above with reference to FIGS. 3 to 12. For example, a similar arrangement of FIG. 11 may be used, but with p-type transistors for switching circuit 310 and with an interchanging of p-type to n-type, and n-type to p-type, for the transistors making up the first op amp 810 and the second op amp 810. In a further alternative example, two voltage supply circuits 300, each of the same fundamental design and operation as the examples given above, may be used, one for controlling the negative/low supply voltage of the amplifier 330 and the other for controlling the positive/high supply voltage of the amplifier 330 (for example, if $Sig_{in}$ may be a positive or negative signal).

The invention claimed is:

1. A circuit for setting an amplifier supply voltage for an amplifier, the circuit comprising:

a switch circuit comprising:

a first transistor arranged to switchably couple a first supply voltage to a supply terminal of the amplifier; and a second transistor arranged to switchably couple a second supply voltage to the supply terminal of the amplifier, wherein a magnitude of the first supply voltage is greater than a magnitude of the second supply voltage; and a control circuit configured to control the switch circuit to set an amplifier supply voltage at the supply terminal of the amplifier based on an output signal of the amplifier, wherein the control circuit is configured to set the amplifier supply voltage to substantially equal the second supply voltage when a magnitude of a tracking voltage is less than the magnitude of the second supply voltage and set the amplifier supply voltage to track the amplifier output signal when the magnitude of the tracking voltage is greater than the magnitude of the second supply voltage, and wherein the tracking voltage is based on the output signal of the amplifier.

2. The circuit of claim 1, wherein the control circuit is configured to:

when the magnitude of the tracking voltage is less than the magnitude of the second supply voltage, turn off the first transistor and turn on the second transistor, and when the magnitude of the tracking voltage is greater than the magnitude of the second supply voltage, turn on the first transistor and turn off the second transistor.

3. The circuit of claim 2, wherein the control circuit comprises:

a first op amp coupled to the switch circuit and configured to turn on the first transistor when the magnitude of the tracking voltage is greater than the magnitude of the second supply voltage, and turn off the first transistor when the magnitude of the tracking voltage is less than the magnitude of the second supply voltage; and a second op amp coupled to the switch circuit and configured to turn on the second transistor when the magnitude of the tracking voltage is less than the magnitude of the second supply voltage, and turn off the second transistor when the magnitude of the tracking voltage is greater than the magnitude of the second supply voltage.

4. The circuit of claim 2, wherein the tracking voltage is equal to an output voltage of the amplifier plus a headroom voltage, or the tracking voltage is equal to the output voltage.

5. The circuit of claim 1, wherein the second transistor is arranged such that when a magnitude of the amplifier supply voltage is greater than a magnitude of the second supply voltage, a body diode of the second transistor is reverse biased so as to prevent current flow between the first supply voltage to the second supply voltage.

6. The circuit of claim 1, wherein the first transistor and the second transistor are both n-type transistors, and wherein a drain terminal of the first transistor is coupled to the first supply voltage, and a source terminal of the first transistor is coupled to the supply terminal of the amplifier, and wherein a drain terminal of the second transistor is coupled to the supply terminal of the amplifier, and a source terminal of the second transistor is coupled to the second supply voltage.

7. The circuit of claim 1, wherein the first transistor and the second transistor are both p-type transistors, and wherein a source terminal of the second transistor is coupled to the supply terminal of the amplifier, and a drain terminal of the second transistor is coupled to the second supply voltage.

8. A voltage supply circuit configured to set an amplifier supply voltage for a power amplifier, the voltage supply circuit comprising:

a switch circuit for switchably coupling a supply terminal of the power amplifier between a first supply voltage and a second supply voltage, wherein a magnitude of the first supply voltage is greater than a magnitude of the second supply voltage, the switch circuit comprising:

a first transistor comprising a first channel terminal coupled to the first supply voltage and a second channel terminal coupled to the supply terminal of the power amplifier; and a second transistor comprising a first channel terminal coupled to the supply terminal of the power amplifier and a second channel terminal coupled to the second supply voltage, wherein the first transistor and the second transistor are arranged in an anti-series configuration; and a control circuit configured to control the first transistor and the second transistor based on an output signal of the power amplifier.

9. The voltage supply circuit of claim 8, wherein the first transistor and the second transistor are both n-type transistors, and the first channel terminals are drain terminals and the second channel terminals are source terminals, or the first transistor and the second transistor are both p-type transistors, and the first channel terminals are source terminals and the second channel terminals are drain terminals.

10. The voltage supply circuit of claim 8, wherein the second transistor is arranged such that when a magnitude of the amplifier supply voltage is greater than the magnitude of the second supply voltage, a body diode of the second transistor is reverse biased so as to block current flowing between the supply terminal of the power amplifier and the second supply voltage.

11. The voltage supply circuit of claim 8, wherein the control circuit is configured to, when a magnitude of a tracking voltage is greater than the magnitude of the second supply voltage:

turn on the first transistor such that the first transistor sets the amplifier supply voltage to equal the tracking voltage, and turn off the second transistor to decouple the supply terminal of the power amplifier from the second supply voltage;

wherein the tracking voltage is dependent on the output signal of the power amplifier.

12. The voltage supply circuit of claim 11, wherein the control circuit comprises:

a first op amp comprising:

a first input terminal arranged to receive the amplifier supply voltage;

a second input terminal arranged to receive the tracking voltage; and an output terminal coupled to a control node of the first transistor so as to control the first transistor.

13. The voltage supply circuit of claim 12, configured such that, when the magnitude of the tracking voltage is greater than the magnitude of the second supply voltage, the first op-amp outputs a signal to turn on the first transistor by an amount necessary such that the amplifier supply voltage at the first input terminal is equal to the tracking voltage at the second input terminal.

14. The voltage supply circuit of claim 11, wherein the control circuit is further configured to, when the magnitude of the tracking voltage is less than the magnitude of the second supply voltage:

turn off the first transistor to decouple the supply terminal of the power amplifier from the first supply voltage, and turn on the second transistor to couple the supply terminal of the power amplifier to the second supply voltage.

15. The voltage supply circuit of claim 14, wherein the control circuit comprises:

a second op amp comprising:

a first input terminal arranged to receive the amplifier supply voltage;

a second input terminal arranged to receive the second supply voltage; and an output terminal coupled to a control node of the second transistor so as to turn the second transistor off when the magnitude of the amplifier supply voltage is greater than the magnitude of the second supply voltage and turn the second transistor on when the magnitude of the amplifier supply voltage is less than the magnitude of the second supply voltage.

16. The voltage supply circuit of claim 15, wherein the second transistor is a p-type LDMOS transistor or an n-type LDMOS transistor.

17. The voltage supply circuit of claim 11, wherein the tracking voltage is a sum of an output voltage of the power amplifier and a predetermined headroom voltage.

18. A supply circuit configured to set an amplifier supply voltage for an amplifier, the supply circuit comprising:

a first transistor arranged to switchably couple a first supply voltage to a supply terminal of the amplifier;

a second transistor arranged to switchably couple a second supply voltage to the supply terminal of the power amplifier, wherein a magnitude of the first supply voltage is greater than a magnitude of the second supply voltage; and a control circuit configured to control the first transistor and the second transistor based on an output signal of the amplifier, wherein the supply circuit is configured such that:

when a magnitude of a tracking voltage is greater than the magnitude of the second supply voltage, the first transistor turns on and uses the first supply voltage to set the amplifier supply voltage to substantially equal the tracking voltage, and the second transistor turns off to decouple the supply terminal of the power amplifier from the second supply voltage; and when the magnitude of the tracking voltage is less than the magnitude of the second supply voltage, the first transistor turns off to decouple the supply terminal of the power amplifier from the first supply voltage, and the second transistor turns on to couple the supply terminal of the power amplifier to the second supply voltage and set the amplifier supply voltage to substantially equal the second supply voltage, wherein the tracking voltage is dependent on the output signal of the amplifier.

19. The voltage supply circuit of claim 18, wherein the control circuit is configured, when the magnitude of the tracking voltage is greater than the magnitude of the second supply voltage, to turn on the first transistor by an amount necessary to set the amplifier supply voltage to equal the tracking voltage.

20. The voltage supply circuit of claim 18, wherein the tracking voltage is an output voltage of the amplifier plus a predetermined headroom voltage.

* * * * *